United States Patent [19]

Chen et al.

[11] Patent Number: 5,060,190
[45] Date of Patent: Oct. 22, 1991

[54] READ ONLY MEMORY WITH WRITE OPERATION USING MASK

[75] Inventors: Ying-Cheng Chen; Bau-Tong Dai, both of Hsinchu, Taiwan

[73] Assignee: Industrial Technology Research Institute, Taiwan

[21] Appl. No.: 584,347

[22] Filed: Sep. 18, 1990

[51] Int. Cl.$^5$ ............................................. G11C 13/00
[52] U.S. Cl. ...................................... 365/104; 365/51
[58] Field of Search ..................... 365/104, 94, 51, 182

[56] References Cited

U.S. PATENT DOCUMENTS 4,565,712  1/1986  Noguchi .............................. 427/53.1

Primary Examiner—Terrell W. Fears
Attorney, Agent, or Firm—George O. Saile

[57] ABSTRACT

An FET ROM and a manufacturing process in which ROM's can be stockpiled after the gates have been formed and the source and drain implants have been made but before the write operation has been performed. At this stage, the unwritten ROM has an array of enhancement mode FET's connected in a logical NAND configuration with an overlying layer of insulation. For a write operation, the insulation is removed to expose the drain and source regions of the FET's, a conductive layer is formed over the array, and the layer is selectively etched to leave a short circuit element between the drain and source of those FET's that are to store a binary 0 and to leave switchable the FET's that are to store a 1.

7 Claims, 1 Drawing Sheet

READ ONLY MEMORY WITH WRITE OPERATION USING MASK

FIELD OF THE INVENTION

This invention relates to static information storage devices, and more specifically it relates to a read only memory (ROM) that uses a field effect transistor (FET) in a storage cell which holds one bit and to a process for manufacturing this ROM.

THE RELATED ART

Although FET ROM's are well known, it will be helpful to review the features and terminology that particularly relate to this invention. ROM's are useful for holding information that is not changed during the life of the ROM, for example, a programming routine that performs initial program load for a data processor. In an FET ROM, the data is written into the ROM as part of the manufacturing process. The writing process is also called coding.

In an FET storage cell, a binary 0 or 1 is represented by the conductive state of the FET. Arbitrarily, a 0 will be assigned to an FET that conducts between its drain and source and a 1 will be assigned to a non-conducting FET. During the write operation for some ROM's (as explained later), cells that are to store a 0 are made permanently conductive. In other ROM's, FET's that are to store a 1 are made permanently nonconductive. From a different standpoint, in a ROM in which a binary 0 is represented by an FET that has been made permanently conductive, a 1 is represented by an FET that is switchable. Conversely, in ROM's that represent a 1 by an FET that is permanently non-conductive, a 0 bit is represented by a switchable FET.

ROM Array Organization

The multi-bit unit of data that is accessed on a read operation is called a word. In concept, the FET's are arranged in a row and column array with the words running in one dimension and the bit positions of the words running in the other dimension. The bit positions of a word are commonly given a sequence of identifying numbers. Commonly, all of the bits of a word and the associated addressing circuits are located on the same chip and the term ROM is used either for a chip containing a read only memory or for a read only memory that is implemented in one or more chips.

Each word has a conductive line (called a word address line or just a word line) that forms the gate of each FET in the word (or interconnects separately formed gates). Address decoding circuits, which are located outside the array area of the chip, produce voltages on the word lines to enable the FET's to switch for a read operation. Addressing circuits are well known and do not require further description. They are also called selection circuits.

This invention uses an array organization that is called a NAND array. It will be convenient to introduce the general features of ROM arrays by first reviewing a more familiar array organization that is called a NOR array. In a NOR array, each bit position has a conductive line, called a bit line, that is connected to the drain of each FET of the bit position. In a read operation, a voltage on the gates of the FET's along a word line enables these FET's to turn on. (The other cells in the array do not conduct; the cells storing a 1 are made permanently non-conductive and the switchable FET's are not enabled to turn on.) Along the addressed word line, the switchable FET's (which store 0 bits) turn on. The term "NOR array" comes from the fact that the FET's along a bit line form a NOR (ORInvert) logic circuit.

Sensing circuits outside the array receive the currents from FET's that conduct, and the sensing circuits signal the binary values that these currents signify. Commonly the drain current is detected as a fall in voltage (toward ground) at a load resistor for the FET's of the same bit position. (Thus the convention that a conducting cell holds a 0 corresponds to the common convention that an up signal level represents a 1 and a down level represents a 0.) Sense circuits are well known and do not require further description.

In a NAND array, which is used in this invention, the FET's of the same bit position have their source-drain circuits connected in series to form a NAND logic circuit. For storing a 0 bit, a cell is made permanently conductive. In a read operation all of the FET's conduct except the FET's of the addressed word, which turn off. The sensing circuits receive the currents from the bit positions and detect the 1 bits stored by switchable transistors and the 0 bits stored by permanently conductive cells.

Addressing for cells having enhancement mode or depletion mode FET's

An enhancement mode FET is off when its gate has the same voltage as the substrate and it turns on when the gate is given a suitable voltage. In a NAND array with enhancement mode FET's, the cells that store a 0 are made permanently conductive and the cells that store a 1 remain switchable. For a read operation, the switchable FET's of the non-addressed words are turned on (like the permanently conductive cells), and the cells of addressed word are turned off. A depletion mode FET switches in the opposite way: it is on when the gate has the same voltage as the substrate and it turns off when the gate is given a suitable voltage.

THE PRIOR ART

It is a general object in this art to perform the write operation after most time consuming parts of the manufacturing process have been completed and to thereby produce a completed ROM a short time after a user of the ROM (a customer) has specified the program or other data that the array is to store.

The prior art has suggested making selected FET's permanently conductive by ion implantation through the gate after the device has been completed. This writing technique is not usable with arsenic impurities (to produce an n-type channel) because the ions are too large to pass through the polysilicon gate.

An FET ROM having a NAND array is described in U.S. Pat. No. 4,565,712. Common regions function as the source for one FET and the drain for the one below in the series circuit. The FET's are initially enhancement mode: they are off until they receive a suitable gate voltage. The cells that are to store a 1 are made permanently conductive.

In the structure of '712, a film of polysilicon or amorphous silicon (film 20 in FIG. 1(D) of '712) is formed over the FET's of each bit position and is arranged to contact each drain and source region. The film is initially non-conductive and has no effect on the operation of the FET's. In a write operation, the film at selected

3

FET's is heated to increase the grain size and thereby make the associated cell permanently conductive. This writing technique may be difficult to use with a ROM having small cells because there are inaccuracies in positioning the beam, a laser with a suitably small beam may not be available, and the heating effect may extend beyond the region of the laser beam.

SUMMARY OF THE INVENTION

This invention provides an improved FET ROM in which the write operation is performed after time consuming parts of the manufacturing process have been completed.

In the process of the invention, a storage array is formed of enhancement type FET's. The preferred array has common source and drain regions for the FET's of each bit position, as in the NAND organization of the prior art. In a write operation, a short circuit element is formed between the source and the drain of each FET that is to hold a binary 0. This short circuit element is formed above the gate (as is the conductive element of '712) and therefore the gate and the associated diffusions can be completed before the write operation. A layer of insulation is formed over the gates without regard to the data pattern that will later be written into the array. This insulation is then etched to expose the drain and source region of each FET for a later write operation. Initially a layer of conductive material (for example, doped polycrystaline silicon or metal) is formed over the entire array area of the chip and is arranged to contact each source region, drain region, and common source-drain region of the array. In the write operation, the conductive layer is removed except between the source and drain regions of the FET's that are to be permanently conductive to store a binary 0.

The write operation uses mask techniques and etch steps that are conventional in other semiconductor manufacturing processes.

The resistance of the bit defining conductor is significantly less than the channel resistance of the FET's in the NAND configuration, and it thereby speeds up the switching operation of the array and increases the current that a column of FET's produces on a read operation.

With this sequence of manufacturing steps, the bit defining conductor can be formed of a metal, aluminum for example. The resistance of a metal conductor is significantly less than the resistance of the polysilicon conductor of '712. Alternatively, the conductor can be formed of polysilicon.

The other steps of the manufacturing process are conventional, and this ROM has the high chip density and the customary costs of other NAND ROM's.

THE DRAWING

THE PREFERRED EMBODIMENT

Introduction

Figure 1:
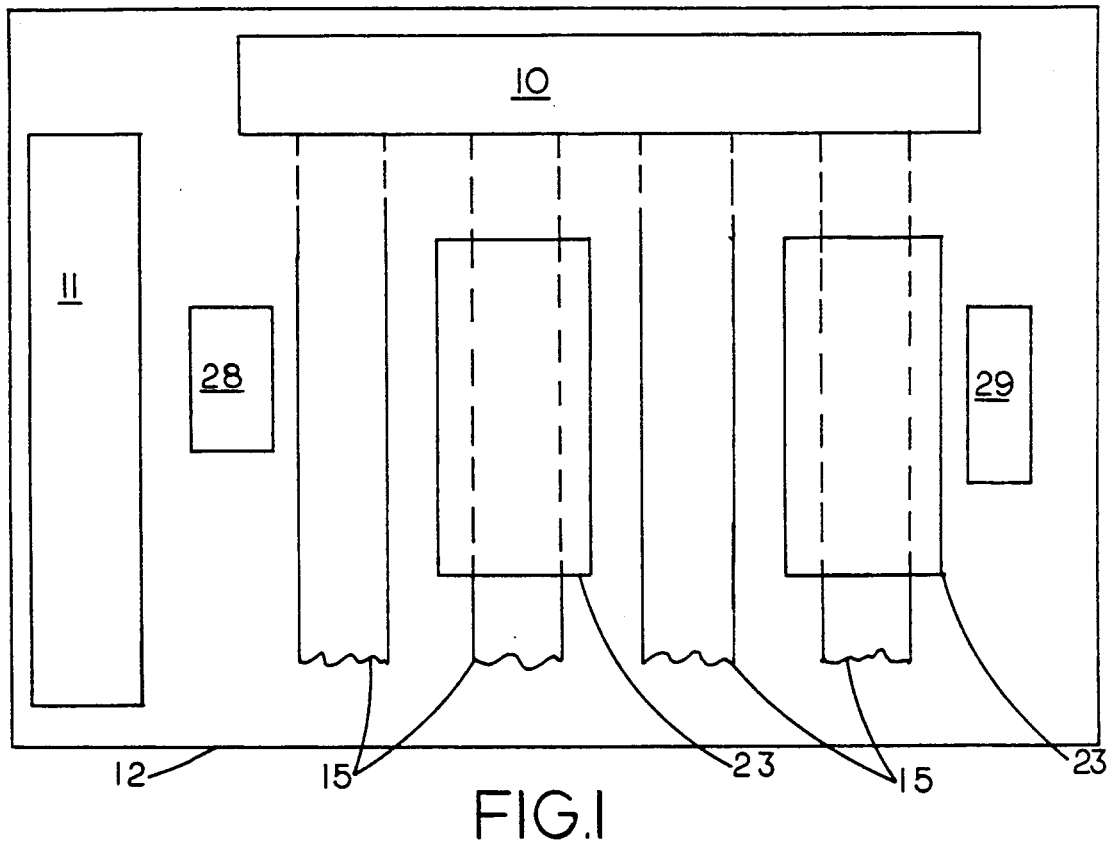
FIG. 1 is a top view of the semiconductor device of this invention showing representative storage cells.

The top view of the chip in FIG. 1 has been simplified to show the address circuits 10 and the bit sensing circuits 11 as functional blocks. Circuits 10 and 11 are commonly called support circuits. The support circuits may be implemented in a different technology, preferably CMOS, as is well known and does not require further description. The drawing is oriented with the cells of a bit position running horizontally and the cells of a word running vertically. The single bit position shown in the drawing has a four cells, each for a different word, and it illustrate any selected number of words in the array. The single bit position also illustrates a selected number of bit positions (with suitable isolation in between, as is known).

Wafer processing steps before writing

The substrate 12, the field oxide 13, the gate insulation 14, the gates 15, the source and drain regions 16, 17 and 18, and the gate side wall insulation 19 ar conventional and will be understood without specific description. Regions 18 form a common drain for one FET and source for the FET below in the series NAND circuit. Region 16 forms the source for the topmost FET and region 1 forms the source for the bottommost FET. The substrate can be either p-type or n-type except that it must be p-type if the shorting conductors are to be made of metal (to avoid a rectifying junction).

The gate 15 is formed as a conductive word line that runs across each bit position of one word of the array. Each word line extends outside the array to the address circuits 10. In a conventional step of the manufacturing process before the write operation, impurities are implanted for the source and drain regions 16, 17 and 18.

Figure 2A:
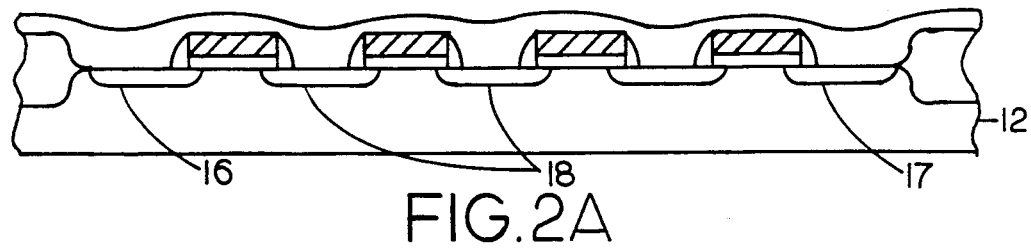
FIG. 2A is a section view of the semiconductor device of FIG. 1 at an intermediate stage in the manufacturing process.
Figure 2B:
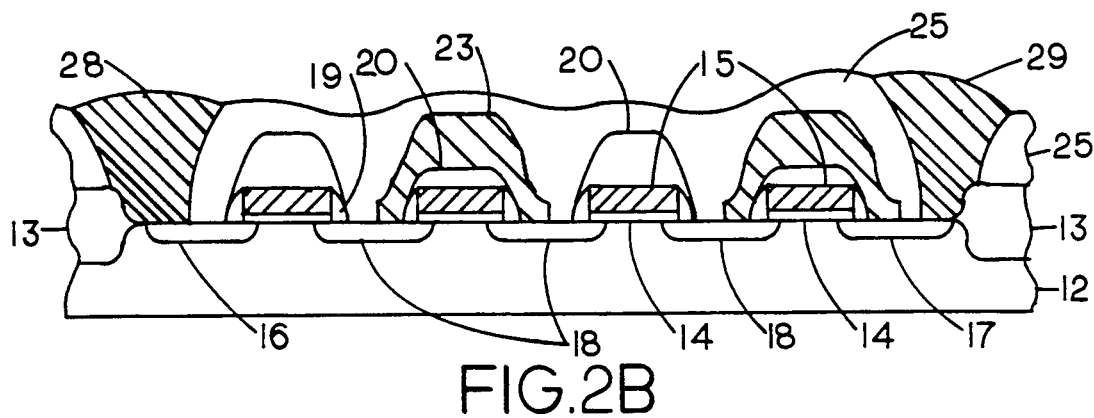
FIG. 2B is a section view of the completed semiconductor device of FIG. 1.

The impurities are diffused through the source and drain regions by heating the wafer, as is conventional, preferably at 900° C. In the process of diffusing the impurities for the drain and source regions, a layer 20 of insulating $SiO_2$ is formed over the tops of gates 15 and over the adjacent source and drain regions 16, 17 and 18. (See FIG. 2A.) In the completed device, the insulation will separate the short circuit elements from the gates 15 (which are electrically interconnected along the word dimension of the array).

The insulation layer 20 is formed at a temperature of about 800 degrees C. to a thickness of about 1000 angstroms over regions 16, 17 and 18 and about 2500 angstroms over the gates. The oxidation process forms a thicker layer over the polycrystaline silicon than over the monocrystaline silicon, as is well known. This difference is significant for the later etch step in which the insulation is removed from the source and drain regions but is not significantly removed from the gates.

At this point, the chip is ready for the write operation and only a few other processing steps are required after the write operation. The chips can now be stockpiled until a user for the ROM has specified the data that is to be written into a chip.

Manufacturing steps for writing

A user of a ROM supplies a list of binary words that are to be stored in a ROM. According to the convention that has been used in this description, cells that are to store a 0 are made permanently conductive and cells that are to store a 1 are left switchable. A mask is made according to this pattern that is suitable for the etch step that forms the short circuit element, as described later.

Insulation layer 20 is etched to form openings in the thin layer over the regions 16, 17 and 18 without regard to the later data pattern that will be written into the array. A suitable mask is made, a photoresist is deposited on the chip and exposed to the mask, the etch step is performed, and the photoresist layer is then removed. These steps are conventional in semiconductor manufacturing.

A layer of polycrystaline silicon is formed over the general area of the array. It is doped with the same impurity type as the drain and source to make it conductive between the drain and source of each cell that is to be made permanently conductive. Thus, at this point in the manufacturing process, a direct short is formed alone each column of FET'S (and incidently between columns).

A photoresist is formed on the chip surface and is exposed under the mask to remove the conductive layer except an isolated shorting element 23 is to remain to make a cell permanently conductive. Note that the conductive layer is removed between bit positions. The photoresist is then removed.

Other Processing Steps After Coding

After the write operation, conventional chip processing steps are continued. A thick layer 25 of a suitable insulation, preferably conventional boron phosphorous silicate glass, is formed over the entire substrate. Openings are made in insulation layers 20 and 25 and contacts 28 and 29 are formed to the source region 16 and the drain region 17. Contacts 28 and 29 connect the FET's of the associated bit position to the sensing circuit 11.

A Read Operation

The preferred FET's are enhancement mode FET's, which are non-conductive in their source-drain circuits until a suitable voltage is applied to their gates. As in the conventional read operation that has already been described, all of the FET's of the unaddressed words are given a gate voltage to enable them to turn on. The switchable FET's of the unaddressed words turn on and the unswitchable FET's of these words are permanently conductive without regard to the addressing circuits. The gates of the addressed word are given a voltage that does not turn on these FET's. The switchable FET's of the addressed word thereby remain off, and the 0 and 1 storing cells of the addressed word provide distinguishable currents at the sensing circuit 11.

OTHER EMBODIMENTS OF THE INVENTION

Many of the steps in the process that has been described are conventional, and equivalent steps will be understood without specific discussion.

Shorting elements 23 can be formed of other conductive materials such as aluminum. The advantages of using a metal layer have been discussed earlier in this specification, and a metal will be the preferred short circuit element in many ROM's. Forming and etching metal layers are common steps in the manufacture of semiconductor devices, and this embodiment will be understood from the previous description.

In some situations, the data pattern may be known before the process is begun, and there is no break in the manufacturing process where the ROM's are to be stockpiled. Thus, from a more general standpoint, the ROM's can be stockpiled at any point in the process that is suitable for a particular manufacturing facility or manufacturing process.

Those skilled in the art will recognize other variations within the spirit of the invention and the scope of the claims.

We claim:

1. A ROM of the type having
an array of FET's connected along the bit dimension of the array in a NAND configuration, each FET having a drain region and a source region, and sensing circuits connected to detect the conduction state of the FET's of each bit position,
whereby in a write operation a cell can be made permanently conductive between its drain and source to store a bit value arbitrarily designated 0 and a cell can be left switchable to store a 1,
means forming FET gates interconnected along the word dimension of the array, and an addressing circuit for addressing a word of the array,
wherein the improvement comprises,
insulation over the gate and the associated source and drain regions of each FET of the array,
openings in the insulation to permit electrical contact with the drain and source regions but maintaining insulation for the gales,
and shorting elements formed selectively at cells that are to be permanently conductive for a predetermined pattern of words to be stored in the ROM, each shorting element being formed between the drain and source of the associated cell and being insulated from the associated gate by the insulation for the gate.

2. The ROM of claim 1 wherein the drain and source regions for adjacent FET's of the same bit position are formed as a common region.

3. The ROM of claim 1 wherein the FET's of the array are enhancement mode FET's.

4. The ROM of claim 1 wherein the openings in the insulation to permit electrical contact with the drain and source regions are formed at the drain and source regions of each FET in the array without regard to a data pattern of words to be stored.

5. The ROM of claim 1 wherein the insulation is silicon dioxide.

6. The ROM of claim 1 wherein the shorting elements are formed of polycrystaline silicon.

7. The ROM of claim 1 wherein the shorting elements are formed of a metal such as aluminum.

* * * * *